United States Patent
Hotta

(10) Patent No.: US 8,310,895 B2
(45) Date of Patent: Nov. 13, 2012

(54) LAYOUT OF MEMORY CELLS AND INPUT/OUTPUT CIRCUITRY IN A SEMICONDUCTOR MEMORY DEVICE

(75) Inventor: Mitsuhiro Hotta, Yokohama (JP)

(73) Assignee: Renesas Electronics Corporation, Tokyo (JP)

( * ) Notice: Subject to any disclaimer, the term of this patent is extended or adjusted under 35 U.S.C. 154(b) by 285 days.

(21) Appl. No.: 12/622,864

(22) Filed: Nov. 20, 2009

(65) Prior Publication Data
US 2010/0135056 A1    Jun. 3, 2010

(30) Foreign Application Priority Data
Nov. 28, 2008    (JP) .................................. 2008-304160

(51) Int. Cl.
*G11C 8/00*    (2006.01)
(52) U.S. Cl. ................ 365/230.03; 365/189.17; 365/205
(58) Field of Classification Search ............. 365/189.17, 365/205, 230.03
See application file for complete search history.

(56) References Cited

U.S. PATENT DOCUMENTS

| 5,995,404 A * | 11/1999 | Nakaumura et al. ............ 365/63 |
| 6,094,382 A * | 7/2000 | Choi et al. ..................... 365/200 |
| 2007/0050530 A1* | 3/2007 | Rajan ............................... 711/5 |

FOREIGN PATENT DOCUMENTS

| JP | 08-116036 A | 5/1996 |
| JP | 3990125 B2 | 3/2003 |

* cited by examiner

*Primary Examiner* — Hoai V Ho
(74) *Attorney, Agent, or Firm* — Sughrue Mion, PLLC

(57) ABSTRACT

A semiconductor memory device includes a memory cell array divided into a plurality of subarrays arranged in matrix form, the plurality of subarrays making up a plurality of subarray columns, an address pad column formed outside the memory cell array, the address pad column comprising a plurality of address pads that are arranged to be substantially parallel to the subarray columns, a data I/O pad column formed in a middle section of the memory cell array, the data I/O pad column comprising data I/O pads that are arranged to be substantially parallel to the subarray columns, an address input circuit arranged in the middle section of the memory cell array, and a pad input address line formed in a direction substantially perpendicular to the subarray columns on the memory cell array, the pad input address line directly connecting the address pad and the address input circuit.

12 Claims, 5 Drawing Sheets

LAYOUT OF MEMORY CELLS AND INPUT/OUTPUT CIRCUITRY IN A SEMICONDUCTOR MEMORY DEVICE

BACKGROUND

1. Field of the Invention

The present invention relates to semiconductor memory devices, and more specifically, to a layout technique of memory cells and peripheral I/Os in a semiconductor memory device.

2. Description of Related Art

Although memory cells have been reduced in size in accordance with miniaturization of processes in semiconductor manufacturing, reduction in size of pads for packaging or the like is not sufficient. Further, increase in the number of pads has been significant in accordance with the increase of the number of product functions, and it is desired to mount as many pads as possible without increasing the size of the chip.

FIG. 4 shows a pattern layout of a semiconductor memory chip assembled in a flip chip package disclosed in Japanese Patent No. 3990125 (Yabe et al.) (patent document 1). In this memory chip, a memory cell array is divided into a plurality of subarrays arranged in matrix form. In this example, the memory cell array is divided into subarrays SA1,1 to SA16,16 of a matrix with 16 rows and 16 columns. Thus, the p-th subarray column (p is an integer smaller than 17) includes sixteen subarrays SAp,1 to SAp,16.

A first peripheral circuit area 11 is formed in a middle section of a subarray matrix, which extends in the column direction, and a second peripheral circuit area 12 is formed in a middle section of the subarray matrix, which extends in the row direction. The first peripheral circuit area 11 supplies a subarray control signal to each of sixteen subarrays SAp,1 to SAp,16 included in the p-th subarray column.

In this example, the first peripheral circuit area 11 is interposed between the eighth and ninth rows of the subarray matrix and includes sense amplifiers. The second peripheral circuit area 12 is interposed between the eighth and ninth columns of the subarray matrix and includes main row decoders. External connection pads are arranged in a middle section of the subarray matrix, which extends in the column direction. In this example, a first pad area 21 is formed between the fourth and fifth rows of the subarray matrix and a second pad area 22 is formed between the twelfth and thirteenth rows thereof.

Paying attention to the first subarray column as a representative example, the first peripheral circuit area 11 supplies subarray control signals from control signal drivers DRV1 to DRV16 to sixteen subarrays SA1,1 to SA1,16 via subarray control signal lines S1,1 to S1,16, respectively.

Subarray control signal lines S1,1 to S1,4 extend to their respective subarrays (SA1,1 to SA1,4), which are located away from the first peripheral circuit area 11, from the first periphery circuit area 11 through the first pad area 21. Subarray control signal lines S1,13 to S1,16 extend to their respective subarrays (SA1,13 to SA1,16), which are located away from the first peripheral circuit area 11, from the first periphery circuit area 11 through the second pad area 22.

FIG. 5 is an enlarged view showing an example of the pattern layout in a neighborhood of the first pad area 21 shown in FIG. 4. For the sake of simplification of layout design, a plurality of subarray control signal lines Sp,1 to Sp,16 are arranged on the p-th subarray column at the same pitches as those of the subarray columns and thus designed hierarchically.

The first pad area 21 includes a plurality of pads Pd and these pads are arranged in the row direction at the same pitches as those of the subarray columns. In the first embodiment, the pads Pd are located on their respective boundaries of the subarray columns, as indicated by the dotted lines in FIG. 4. The second pad area 22 includes a plurality of pads Pd and these pads Pd are arranged in the row direction at the same pitches as those of the subarray columns and located on their respective boundaries of the subarray columns, as indicated by the dotted lines in FIG. 4.

At least some (Sp,1 to Sp,4 and Sp,13 to Sp,16) of the subarray control signal lines Sp,1 to Sp,16, which are connected between the first peripheral circuit area 11 and the subarrays of the subarray columns, are formed linearly such that they can pass between the pads Pd of the first pad area 21 and between the pads Pd of the second pad area 22.

In this example, all the subarray control signal lines Sp,1 to Sp,16 are formed to have the same length as that of a signal line connecting the subarrays SAp,1 and SAp,16 that are farthest from the first peripheral circuit area 11. Furthermore, all the subarray control signal lines Sp,1 to Sp,16 are formed linearly such that they can pass between the pads Pd. The memory chip disclosed in Yabe et al. can be summarized as follows. The memory cell array is divided into subarrays SA1,1 to SA16,16 arranged in matrix form. The peripheral circuit areas 11 and 12 and pad areas 21 and 22 are formed in the middle sections of the subarray matrix. In the pad areas 21 and 22, the plurality of pads Pd are arranged at the same pitches as those of the subarrays, and the subarray control signal lines Sp,1 to Sp,16, which connect the peripheral circuit area 11 and each of the subarrays, are linearly formed such that they can pass between the pads Pd.

The same pattern can thus be designed for each subarray column in laying out the subarray control signal lines Sp,1 to Sp,16. As such, the subarray control signal lines Sp,1 to Sp,16 are not turned so as to detour around the pads of the pad areas 21 and 22 formed halfway through the subarray columns, they can be prevented from increasing in parasitic capacitance and parasitic resistance of the signal lines. Thus, the variations of delay time of subarray control signals supplied to the subarrays can be suppressed, with the result that a high-speed memory chip can be designed.

In order to achieve a high-speed memory such as an SRAM, an SRAM chip capable of a high-speed operation as this example is formed. Then, the SRAM chip is bonded to a chip assembly substrate (not shown) by flip chip bonding and assembled in a package (usually resin-molded). The subarray control signal lines Sp,1 to Sp,16 are formed to have the same length as that of a signal line connecting the subarrays that are farthest from the first peripheral circuit area 11, thereby keeping the parasitic capacitances and parasitic resistances of the respective signal lines constant. Meanwhile, Japanese Unexamined Patent Application Publication No. 8-116036 (patent document 2) discloses a technique of arranging pads on both sides of a memory array.

SUMMARY

In the above-described semiconductor memory chip, a plurality of pads are arranged at pitches corresponding to those of the plurality of subarray columns in the pad area, and the signal lines are each formed linearly such that they can pass between the pads in the pad area. Accordingly, when the number of pads increases with respect to the memory cell area, the area where the signal lines that pass between the pads is formed cannot be secured unless the chip size is increased.

A semiconductor memory device according to a first aspect of an embodiment of the present invention is a semiconductor memory device including a memory cell array that is divided into a plurality of subarrays arranged in matrix form, the plurality of subarrays making up a plurality of subarray columns, a first pad column that is formed outside the memory cell array, the first pad column including a plurality of first pads that are arranged to be substantially parallel to the subarray columns, a second pad column that is formed in a middle section of the memory cell array, the second pad column including second pads that are arranged to be substantially parallel to the subarray columns, a circuit that is arranged in the middle section or at the outside of the memory cell array, and a line that is formed in a direction substantially perpendicular to the subarray columns on the memory cell array, the line being directly connected to the circuit.

Accordingly, it is possible to minimize the increase of the chip size even with the increased number of pads, and to maintain the area where the signal line is formed. Furthermore, as the line is directly connected to the circuit, the signal delay can be reduced.

A semiconductor memory device according to a second aspect of an embodiment of the present invention is a semiconductor memory device including a memory cell array that is divided into a plurality of subarrays arranged in matrix form, the plurality of subarrays making up a plurality of subarray columns, an address pad column that is formed outside the memory cell array, the address pad column including a plurality of address pads that are arranged to be substantially parallel to the subarray columns, a data I/O pad column that is formed in a middle section of the memory cell array, the data I/O pad column including data I/O pads that are arranged to be substantially parallel to the subarray columns, an address input circuit that is arranged in the middle section of the memory cell array, and a pad input address line that is formed in a direction substantially perpendicular to the subarray columns on the memory cell array, the pad input address line directly connecting the address pad and the address input circuit.

Accordingly, it is possible to minimize the increase of the chip size even with the increased number of pads, and to secure the area where the signal line is formed. Further, as the pad input address line directly connects the address input circuit and the address pad, the signal delay can be reduced.

According to the present invention, it is possible to maintain the area where the signal line is formed without increasing the chip size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
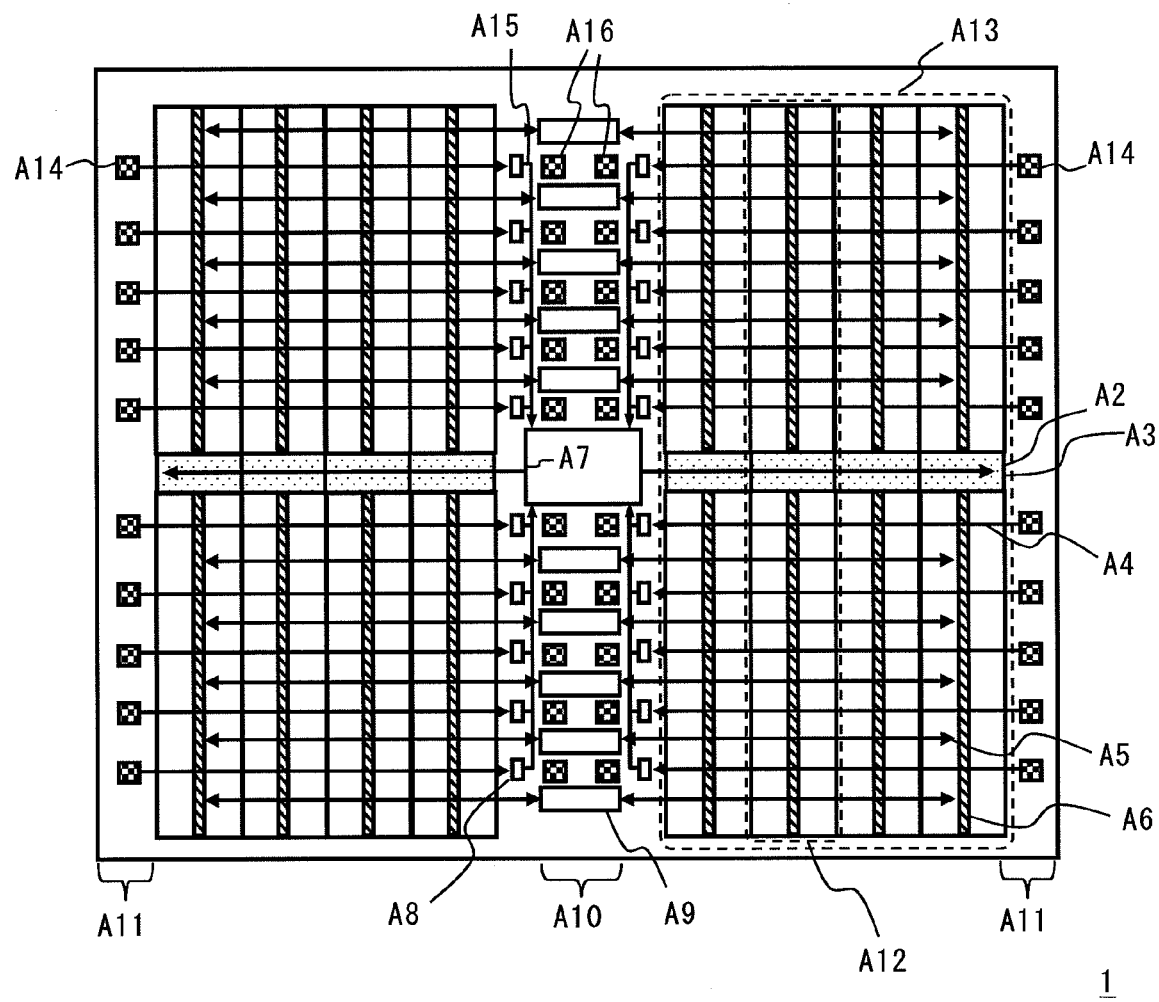
FIG. 1 shows a layout of a semiconductor memory device according to a first exemplary embodiment.

Hereinafter, a semiconductor memory device according to the exemplary embodiments of the present invention will be described with reference to the drawings. The same components throughout the drawings are denoted by the same reference symbols, and the description thereof will be omitted as appropriate. In the drawings, some of the elements of the semiconductor memory device according to the exemplary embodiments are enlarged as appropriate for the purpose of description.

First Exemplary Embodiment

A semiconductor memory device according to the first exemplary embodiment of the present invention will be described with reference to FIG. 1. FIG. 1 is a diagram showing an example of a layout of a semiconductor memory device 1 according to the first exemplary embodiment. The semiconductor memory device 1 according to the first exemplary embodiment shown in FIG. 1 includes a logic circuit and an address register circuit A7, an address input circuit A8, an I/O circuit A9, a data I/O pad column A10, an address pad column A11, and a memory cell array A13.

The memory cell array A13 includes an address decoder circuit A3 and a cell data reading sense amplifier circuit A6. The memory cell array A13 further includes subarrays formed of a plurality of memory cells that are not shown. The plurality of subarrays are arranged in matrix. In FIG. 1, a plurality of subarrays that are arranged in vertical direction (column direction) is called subarray column, and a plurality of subarrays that are arranged in lateral direction (row direction) is called subarray row. In summary, the memory cell array A13 includes a plurality of subarray columns A12.

In the example shown in FIG. 1, the memory cell array A13 is divided into two parts by the data I/O pad column A10. One memory cell array A13 is formed by subarrays of 1 row×4 columns. Further, this memory cell array A13 is arranged in 1 row×2 columns. In other words, the memory cell array A13 is arranged in each of the right side and the left side of the data I/O pad column A10. Further, the four subarray columns A12 are arranged in each of the memory cell arrays A13.

In each of the subarray columns A12, the address decoder circuit A3 and the cell data reading sense amplifier circuit A6 are arranged. In the first exemplary embodiment, the address decoder circuit A3 is arranged in the middle section of each subarray column A12. Further, the cell data reading sense amplifier circuit A6 is formed along with the same direction in which each of the subarray columns A12 is formed.

In the area between two memory cell arrays A13, the data I/O pad column A10 is arranged. In summary, the data I/O pad column A10 is arranged in the middle section of the memory cell arrays A13. The data I/O pad column A10 includes a plurality of I/O pads A16 that are arranged in the same direction in which the subarray column A12 is arranged. In this example, 20 I/O pads A16 are arranged in two lines, each line including 10 pads, in the same direction in which the subarray column A12 is arranged.

The address pad columns A11 are arranged outside the memory cell arrays A13. More specifically, the address pad column A11 is arranged in each of the right area of the right memory cell array A13 and the left area of the left memory cell array A13. In summary, the data I/O pad column A10 and each of the address pad columns A11 are arranged to be opposed with each other with the memory cell arrays A13 interposed therebetween.

The address pad column A11 includes a plurality of address pads A14 that are arranged in the same direction in which the subarray column A12 is arranged. In this example, 20 address pads A14 are arranged in two lines, each line including 10 pads, outside the left and right memory cell arrays A13 in the same direction in which the subarray column A12 is arranged. The address pads A14 are formed in chip ends.

In the middle section in the column direction of the area where the data I/O pad column A10 is arranged, the logic circuit and the address register circuit A7 is arranged. Further, the I/O circuits A9 are arranged to be adjacent to the column direction of each I/O pad A16. In FIG. 1, the I/O circuits A9 are arranged in the upper side of the I/O pads 16 in the column direction in the upper side of the logic circuit and the address register circuit A7. Further, the I/O circuits A9 are arranged in the lower side of the I/O pads A16 in the column direction in the lower side of the logic circuit and the address register circuit A7.

Between the data I/O pad column A10 and each of the memory cell arrays A13, a plurality of address input circuits A8 are provided. In summary, the address input circuits A8 are arranged in the middle section of the memory cell arrays A13. In this example, 10 address input circuits A8 are arranged in each of an area between the data I/O pad column A10 and the right memory cell array A13 and an area between the data I/O pad column A10 and the left memory cell array A13. These address input circuits A8 are arranged in the same direction in which the subarray column A12 is arranged.

The address pad A14 and the address input circuit A8 are connected by a pad input address line A4. The pad input address line A4 is formed in a direction that is perpendicular to the data I/O pad column A10, the address pad column A11, and the subarray column A12 on the memory cell array A13. The pad input address line A4 connects the address pad A14 and the address input circuit A8 without passing through the circuit element.

The address input circuit A8 is connected to the logic circuit and the address register circuit A7 through an address line A15. The logic circuit and the address register circuit A7 and the address decoder circuit A3 that is in the subarray column A12 are connected by a cell selection address line A2. The cell selection address line A2 is formed in a direction that is perpendicular to the subarray column A12.

Each cell data reading sense amplifier circuit A6 that is in each subarray column A12 and the I/O circuit A9 are connected by a data bus line A5. The data bus line A5 is formed in a direction that is perpendicular to the subarray column A12. Although not shown in FIG. 1, a signal line (word line) to read out information from each memory cell is arranged in the vertical direction (column direction) of FIG. 1 from each memory cell, and a bit line is arranged in the lateral direction (row direction).

In the above-discussed layout, the memory cell arrays A13 are arranged in matrix form, and the data I/O pad column A10 is formed in the middle section of the memory cell arrays A13 and the address pad columns A11 are formed in the both ends of the memory cell arrays A13. Each of the data I/O pad column A10 and the address pad column A11 is arranged in parallel with the subarray column A12.

Further, the pad input address line A4 is formed in a direction that is perpendicular to the subarray column A12 on the memory cell array A13. The pad input address line A4 directly connects the address pad A14 in the chip end and the address input circuit A8 that is arranged in the middle section of the memory cell arrays A13 which are divided without passing through the circuit element.

As stated above, the pad line is divided into the data I/O pad column A10 and the address pad column A11, which are arranged separately in the middle section and outside of the memory cell arrays, respectively. Thus, there are memory cell arrays A13 between the data I/O pad column A10 and the address pad columns A11, which prevents the pad lines from being concentrated with each other. Accordingly, the area where the signal line is formed may be maintained.

In the related art, the pads and the input circuit are arranged in the same area, and the signal is drawn from the input circuit by performing buffering. However, according to the first exemplary embodiment, the address pads A14 which are the signal pads are arranged outside the memory cell arrays A13. Further, the line is connected to the input circuit by passing on the memory cell array A13 from the address pad A14. Accordingly, the delay can be reduced.

Second Exemplary Embodiment

Figure 2:
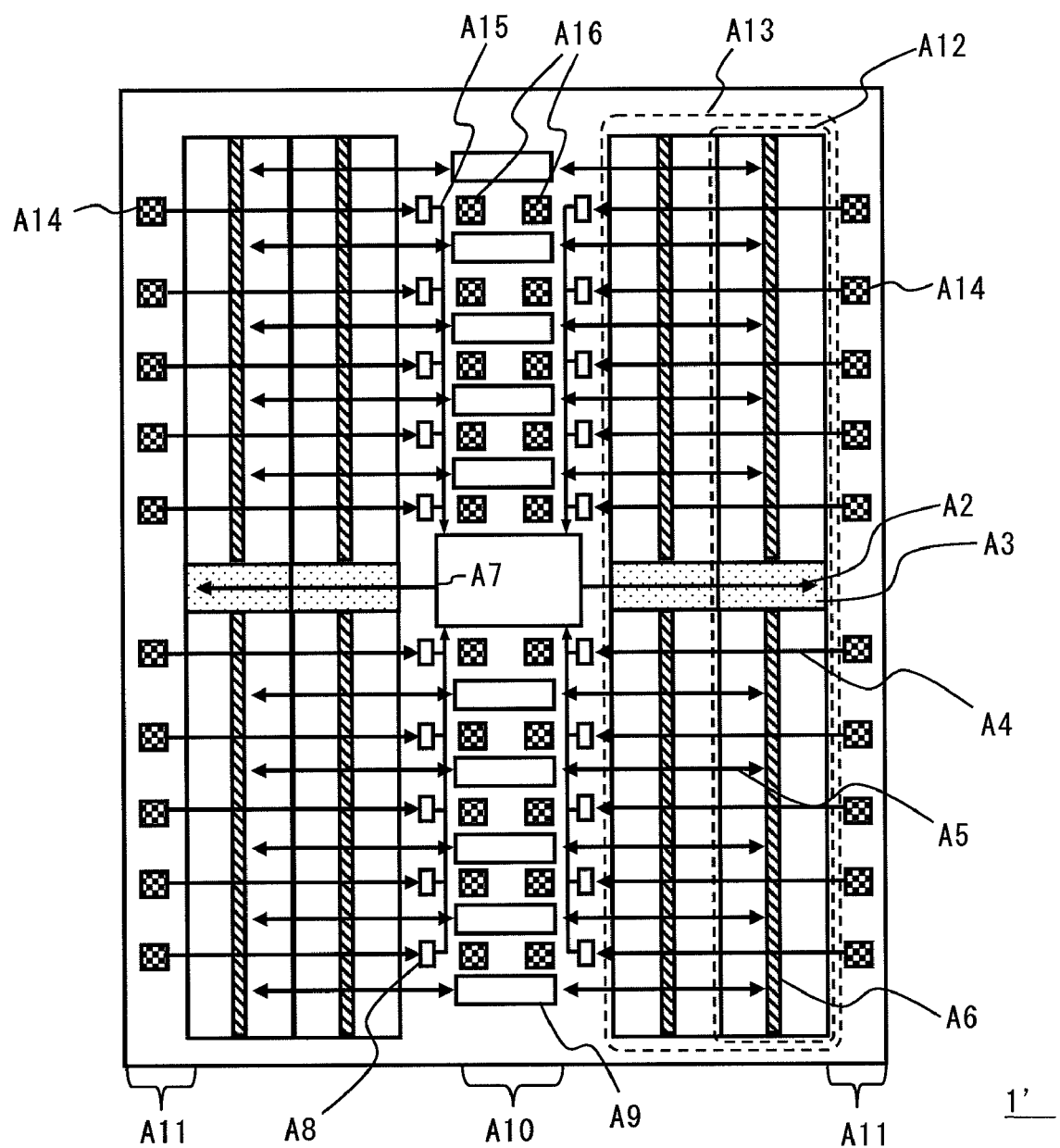
FIG. 2 shows a layout of a semiconductor memory device according to a second exemplary embodiment.

A semiconductor memory device according to the second exemplary embodiment of the present invention will be described with reference to FIG. 2. FIG. 2 is a diagram showing the configuration of a semiconductor memory device 1' according to the second exemplary embodiment. In FIG. 2, the same components as those of FIG. 1 are denoted by the same reference symbols, and the description thereof is omitted.

In developing a product to change the memory capacitance, it may be required to increase or decrease the number of columns of the subarray column A12 and to move the address pads A14. In the second exemplary embodiment, the memory cell array A13 which is formed by the subarray columns A12 of 1 row×4 columns in the first exemplary embodiment is changed to the subarray columns A12 of 1 row×2 columns. In short, the area of the memory cell array A13 is reduced to decrease the chip size.

As shown in FIG. 2, the memory cell array A13 is divided into two parts by the data I/O pad column A10. One memory cell array A13 is formed by subarrays of 1 row×2 columns. Further, this memory cell array A13 is arranged in 1 row×2 columns. More specifically, the memory cell array A13 is arranged in each of the right side and the left side of the data I/O pad column A10. Further, two subarray columns A12 are arranged in each of the memory cell arrays A13.

Further, the address pad columns A11 are moved to the middle section of the memory cell arrays A13 where the data I/O pad column A10 is formed in accordance with the reduced amount of the memory cell arrays A13 in the area outside the memory cell arrays A13.

The pad input address line A4 and the data bus line A5 that are formed in the direction that is perpendicular to the subarray column A12 are made shorter in accordance with the reduced number of columns of the subarray columns A12. According to such a configuration, even when the memory cell capacity is changed, the chip may be formed by just changing the number of columns of the subarray column A12. Further, even when the memory cell capacity is reduced and the number of pads is not changed, the area where the signal line is formed can be maintained without increasing the chip size.

In such a case that the product is developed by increasing or decreasing the memory cell capacity, there is no pad column and peripheral circuit in a side where the chip size is reduced. Accordingly, the area where the signal line is formed may be secured without giving an influence on the peripheral circuit area. Further, it is possible to form the chip in a simple manner by just reducing the memory cell array area.

Third Exemplary Embodiment

Figure 3:
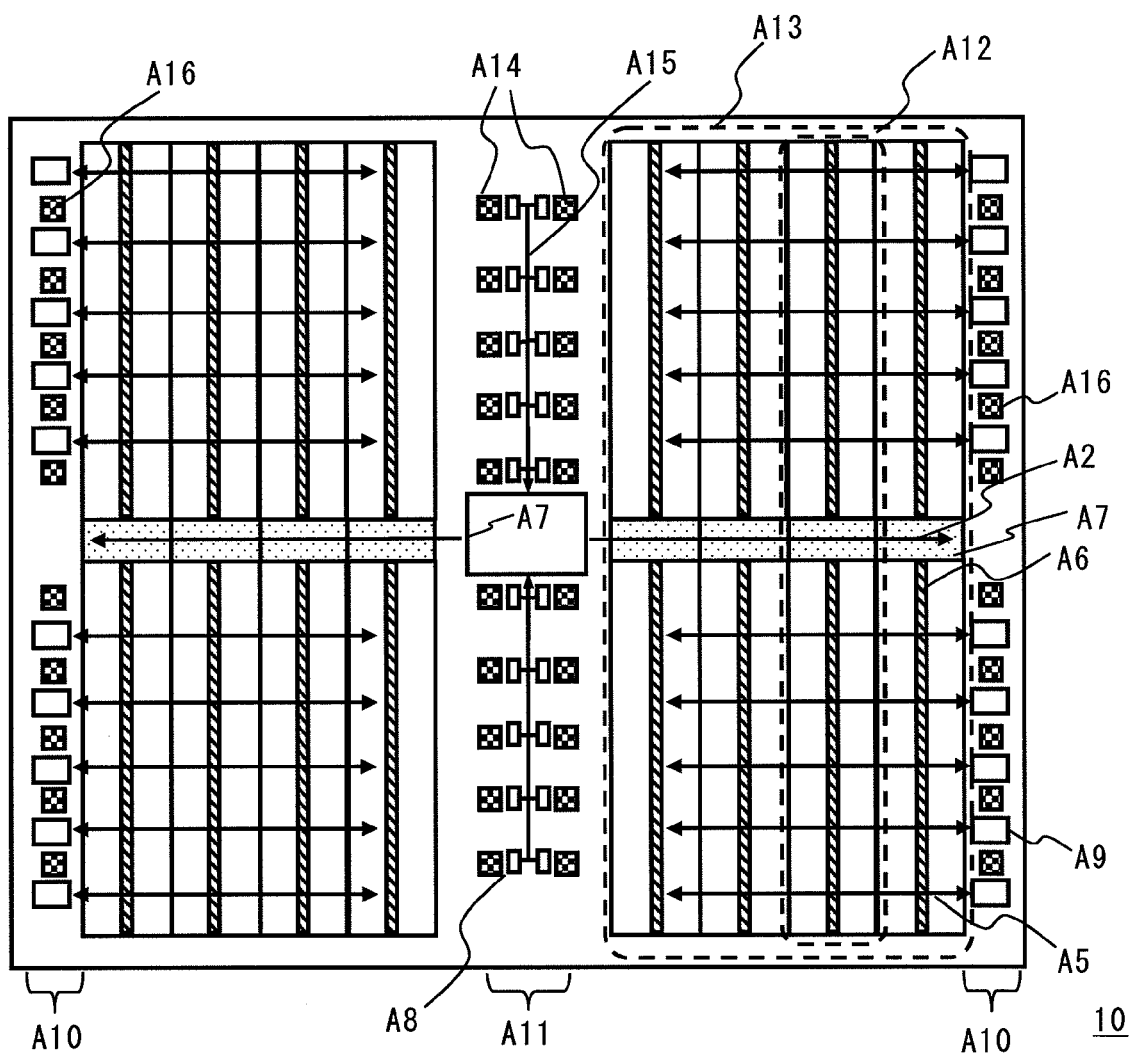
FIG. 3 shows a layout of a semiconductor memory device according to a third exemplary embodiment.
Figure 4:
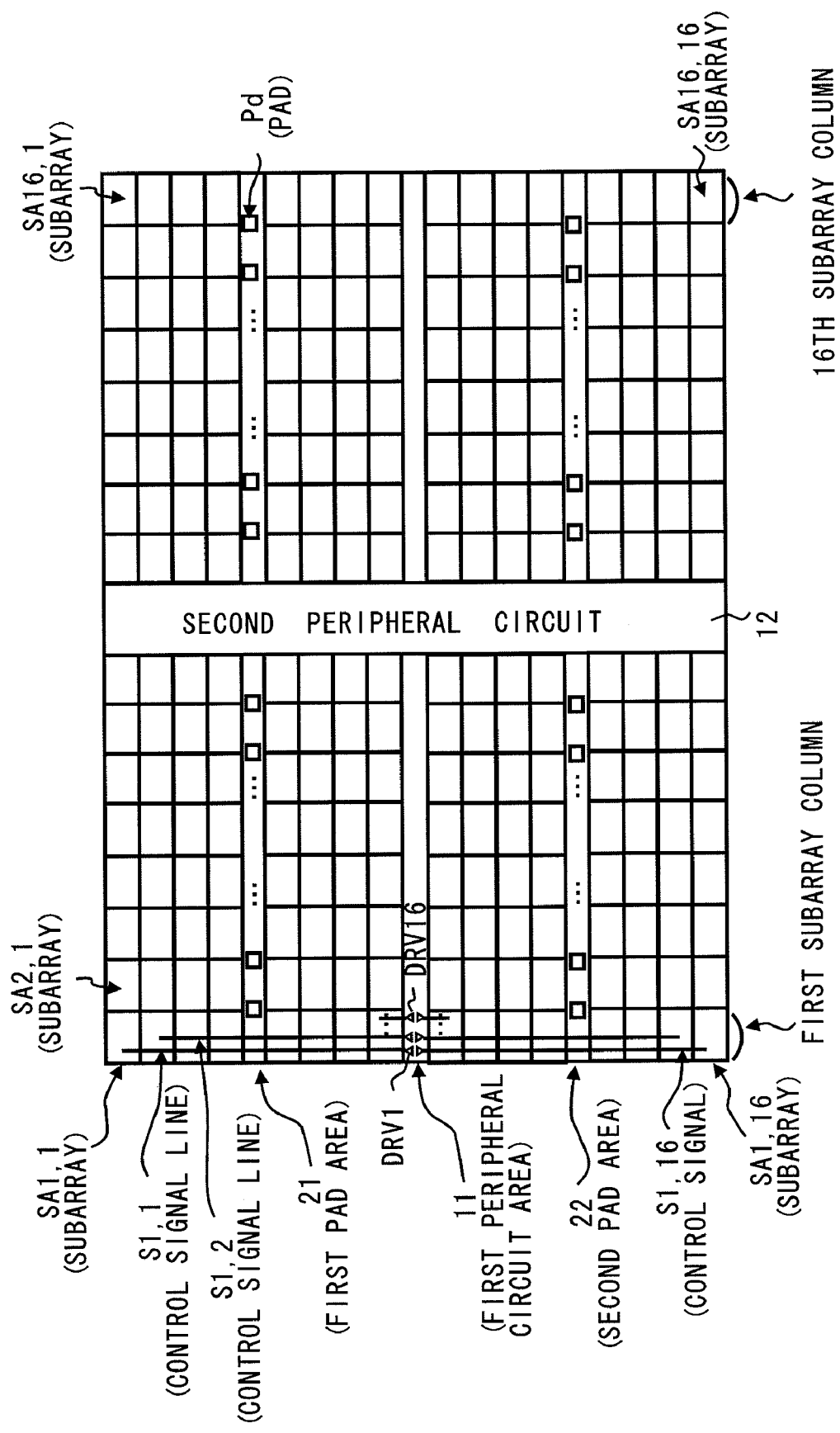
FIG. 4 shows a layout of a semiconductor memory device according to a patent document 1.
Figure 5:
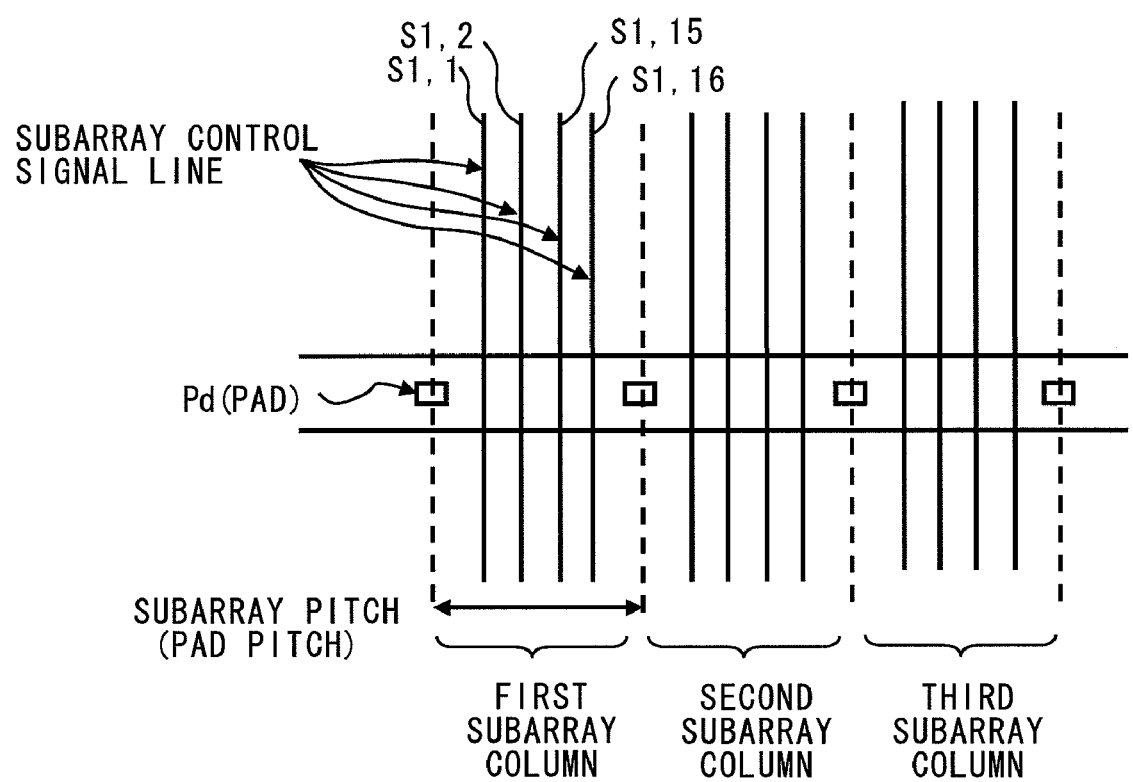
FIG. 5 shows a layout of a pad area in FIG. 4.

A semiconductor memory device according to the third exemplary embodiment of the present invention will be described with reference to FIG. 3. FIG. 3 is a diagram showing the configuration of a semiconductor memory device 10 according to the third exemplary embodiment. In FIG. 3, the same components as those of FIG. 1 are denoted by the same reference symbols, and the description thereof will be omitted.

According to the product specification or the memory cell configuration, the address pad column A11 in which the plurality of address pads A14 are arranged may be arranged in the area of the middle section of the memory cell arrays A13 that are divided into two lines in the first exemplary embodiment. As shown in FIG. 3, the address pads A14 are arranged in the area between the memory cell arrays A13 that are divided in two lines. In summary, the address pads A14 are arranged in the middle section of the memory cell arrays S13. The address pad column A11 includes a plurality of address pads A14 that are arranged in the same direction in which the subarray column A12 is arranged. In the third exemplary embodiment, 20 address pads A14 are arranged in two lines, each line including 10 pads, in the same direction in which the subarray column A12 is arranged.

On the other hand, the data I/O pad columns A10 are arranged in both outside parts of the memory cell arrays A13. More specifically, the data I/O pad column A10 is arranged in each of the right area of the right memory cell array A13 and the left area of the left memory cell array A13. The data I/O pad column A10 includes a plurality of I/O pads A16 that are arranged in the same direction in which the subarray column A12 is arranged. In the third exemplary embodiment, 20 I/O pads A16 are arranged in two line, each line including 10 pads, in a way they are arranged outside the left and right memory cell arrays A13 in the same direction in which the subarray column A12 is arranged. The I/O pads A16 are formed in the chip ends.

Further, in the middle section in the column direction of the area where the address pads A14 are arranged, the logic circuit and the address register circuit A7 is arranged. Further, the I/O circuits A9 are arranged to be adjacent to the column direction of the I/O pads A16. In FIG. 3, the I/O circuits A9 are arranged in the upper side in the column direction with respect to the address pads A14 in the upper side of the logic circuit and the address register circuit A7. Further, the I/O circuits A9 are arranged in the lower side in the column direction with respect to the I/O pads A16 in the lower side of the logic circuit and the address register circuit A7. In short, the I/O pads A16 and the I/O circuits A9 are alternately arranged.

A plurality of address input circuits A8 are arranged between the two lines of the address pads A14. In accordance with the address pads A14, 20 address input circuits A8 are arranged in two lines. Although not shown in FIG. 3, the address pad A14 and the address input circuit A8 are directly connected by the pad input address line. Accordingly, the similar effect as that of the first and second exemplary embodiments may be obtained.

As discussed above, according to the present invention, each pad column can be arranged separately in the middle section and the outside of the memory cell array, whereby it is possible to secure the signal line area without affecting the chip size even with the increased number of pads with respect to the area of the memory cell array. Furthermore, the pads and the input circuits can be directly connected by the lines passing on the memory cell without passing through the circuit element, whereby the signal delay can be reduced. Further, probe cards may be manufactured in an easy way as the pad column arranged in the middle section of the memory cell arrays is apart from the pad columns arranged in the chip ends.

Further, as there is no pad column and peripheral circuit in a side where the chip size is reduced, the area of the peripheral circuit is not changed. Accordingly, when another chip is made by increasing or decreasing the memory cell capacity, the chip can be formed in a simple way by just reducing the memory cell array area. As each pad is arranged separately in the middle section and the chip ends of the memory cell arrays, it is possible to prevent the package substrate line from being concentrated around pads. Accordingly, the package substrate pattern can be designed in a simple way.

The first, second and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory device comprising:
    a memory cell array that is divided into a plurality of subarrays arranged in matrix form, the plurality of subarrays making up a plurality of subarray columns, and each of the subarrays having a sense amplifier unit;
    a first pad column that is formed outside the memory cell array, the first pad column comprising a plurality of first pads that are arranged in a first direction being elongated to run substantially parallel to a word line;
    a second pad column that is formed in a middle section of the memory cell array, the second pad column comprising a plurality of second pads that are arranged to be substantially parallel to the first direction,
    a circuit that is arranged in the middle section or at the outside of the memory cell array; and
    a line that is formed in a second direction substantially perpendicular to the first direction, the line being directly connected to the circuit,
    wherein the sense amplifier unit includes a plurality of sense amplifier circuits which are arranged continuously in the first direction.

2. The semiconductor memory device according to claim 1, wherein
    the first pads are address pads,
    the second pads are I/O pads,
    the circuit comprises an address input circuit arranged in the middle section, and
    the line directly connects the address pad and the address input circuit.

3. The semiconductor memory device according to claim 1, further comprising a memory cell data reading sense amplifier circuit that is arranged in the memory cell array, wherein
    the circuit comprises an I/O circuit arranged in the middle section, and
    the line directly connects the data reading sense amplifier circuit and the I/O circuit.

4. The semiconductor memory device according to claim 2, further comprising a memory cell data reading sense amplifier circuit that is arranged in the memory cell array; and a second line that is formed in a direction substantially perpendicular to the subarray columns on the memory cell array, wherein the circuit comprises an I/O circuit arranged in the middle section, and the second line directly connects the data reading sense amplifier circuit and the I/O circuit.

5. The semiconductor memory device according to claim 1, wherein the first pads are I/O pads, and the second pads are address pads.

6. The semiconductor memory device according to claim 1, further comprising a memory cell data reading sense amplifier that is arranged in the memory cell array, wherein the circuit comprises an I/O circuit arranged in the outside, and the line directly connects the data reading sense amplifier circuit and the I/O circuit.

7. The semiconductor memory device according to claim 5, further comprising a memory cell data reading sense amplifier circuit that is arranged in the memory cell array, wherein the circuit comprises an I/O circuit arranged in the outside, and the line directly connects the memory cell data reading sense amplifier circuit and the I/O circuit.

8. The semiconductor memory device according to claim 1, further comprising an address register and a control logic circuit arranged in the middle section of the memory cell array and connected to the address input circuit.

9. The semiconductor memory device according to claim 1, wherein the second pads are arranged in at least two lines in the middle section of the memory cell array.

10. The semiconductor memory device according to claim 1, wherein the first pads are arranged along two opposite sides of the memory cell array.

11. The semiconductor memory device according to claim 1, wherein each of the plurality of first pads and the plurality of second pads is arranged to be substantially parallel to a word line.

12. The semiconductor memory device according to claim 1, wherein said sense amplifier unit has a length and a width such that the length is greater than the width, and said sense amplifier unit is arranged such that the length of said sense amplifier unit is oriented in the first direction.

* * * * *

UNITED STATES PATENT AND TRADEMARK OFFICE
CERTIFICATE OF CORRECTION

PATENT NO. : 8,310,895 B2  
APPLICATION NO. : 12/622864  
DATED : November 13, 2012  
INVENTOR(S) : Mitsuhiro Hotta Page 1 of 1

It is certified that error appears in the above-identified patent and that said Letters Patent is hereby corrected as shown below:

Title Page, Item (73) should read:

(73) Assignee: Renesas Electronics Corporation,
Kanagawa (JP)

Signed and Sealed this
Twenty-fifth Day of March, 2014

Michelle K. Lee
*Deputy Director of the United States Patent and Trademark Office*